United States Patent
Hsieh

(10) Patent No.: US 8,373,225 B2
(45) Date of Patent: Feb. 12, 2013

(54) SUPER-JUNCTION TRENCH MOSFET WITH RESURF STEPPED OXIDES AND SPLIT GATE ELECTRODES

(75) Inventor: Fu-Yuan Hsieh, New Taipei (TW)

(73) Assignee: Force Mos Technology Co., Ltd. (TW)

( * ) Notice: Subject to any disclaimer, the term of this patent is extended or adjusted under 35 U.S.C. 154(b) by 0 days.

(21) Appl. No.: 13/303,474

(22) Filed: Nov. 23, 2011

(65) Prior Publication Data
US 2012/0061754 A1  Mar. 15, 2012

Related U.S. Application Data

(63) Continuation-in-part of application No. 12/654,637, filed on Dec. 28, 2009, now Pat. No. 8,067,800.

(51) Int. Cl.
*H01L 29/78* (2006.01)
*H01L 21/336* (2006.01)

(52) U.S. Cl. ............ 257/331; 438/270; 257/E29.262; 257/E21.41

(58) Field of Classification Search ............ 438/270; 257/330, 331, E21.41, E29.262
See application file for complete search history.

(56) References Cited

U.S. PATENT DOCUMENTS
8,067,800 B2 * 11/2011 Hsieh ........................ 257/331
* cited by examiner

*Primary Examiner* — Calvin Lee
*Assistant Examiner* — Monica D Harrison
(74) *Attorney, Agent, or Firm* — Bacon & Thomas, PLLC

(57) ABSTRACT

A super-junction trench MOSFET with Resurf Stepped Oxide and split gate electrodes is disclosed. The inventive structure can apply additional freedom for better optimization of device performance and manufacturing capability by tuning thick oxide thickness to minimize influence of charge imbalance, trapped charges, etc. Furthermore, the fabrication method can be implemented more reliably with lower cost.

21 Claims, 19 Drawing Sheets

SUPER-JUNCTION TRENCH MOSFET WITH RESURF STEPPED OXIDES AND SPLIT GATE ELECTRODES

CROSS-REFERENCE TO RELATED APPLICATION

This application is a Continuation-In-Part of U.S. patent application Ser. No. 12/654,637 of the same inventor, filed on Dec. 28, 2009 entitled "super-junction trenched MOSFET with Resurf Step Oxide and the method to make the same".

FIELD OF THE INVENTION

This invention relates generally to the cell structure, device configuration and fabrication process of power semiconductor devices. More particularly, this invention relates to a novel and improved cell structure, device configuration and improved fabrication process of a super-junction MOSFET (Metal Oxide Semiconductor Field Effect Transistor).

BACKGROUND OF THE INVENTION

Compared to the conventional trench MOSFETs, super-junction trench MOSFETs are more attractive due to higher breakdown voltage and lower specific Rds (drain-source resistance). As is known to all, a super-junction trench MOSFET is implemented by a p type column structure and an n type column structure arranged in parallel and connecting to each other onto a heavily doped substrate, however, the manufacturing yield is not stable because it is very sensitive to the fabrication processes and conditions such as: the p type column structure and the n type column structure dopant re-diffusion issue induced by subsequent thermal processes; trapped charges within the column structure, etc. . . . . All that will cause a hazardous condition of charges imbalance to the super-junction trench MOSFET. More specifically, these undesired influences become more pronounced with a narrower column structure width for a lower bias voltage ranging under 200V.

Prior art (paper "Industrialization of Resurf Stepped Oxide Technology for Power Transistor", by M. A. Gajda, etc., and paper "Tunable Oxide-Bypassed Trench Gate MOSFET Breaking the Ideal Super-junction MOSFET Performance Line at Equal Column Width", by Xin Yang, etc.) disclosed device structure in order to resolve the limitation caused by the conventional super-junction trench MOSFET discussed above, as shown in FIG. 1A and FIG. 1B. Except some different terminologies (the device structure in FIG. 1A named with RSO: Resurf Stepped Oxide and the device structure in FIG. 1B named with TOB: Tuable Oxide-Bypassed), both the device structures in FIG. 1A and FIG. 1B are basically the same which can achieve a lower specific Rds and a higher breakdown voltage than a conventional super-junction trench MOSFET because each the epitaxial layer formed in FIG. 1A and FIG. 1B has a higher doping concentration than the conventional super-junction trench MOSFET.

Refer to FIG. 1A and FIG. 1B again, both the device structures have a deep trench with a thick oxide layer along trench sidewalk and bottom into a drift region. Only difference is that, the device structure in FIG. 1A has a single epitaxial layer (N Epi, as illustrated in FIG. 1A) while the device structure in FIG. 1B has double epitaxial layers (Epi1 and Epi2, as illustrated in FIG. 1B, the Epi1 supported on a heavily doped substrate has a lower doping concentration than the Epi2 near a channel region). Due to the p type column structure and the n type column structure interdiffusion, both the device structures in FIG. 1A and FIG. 1B do not have charges imbalance issue, resolving the technical limitation caused by the conventional super-junction trench MOSFET, however, the benefit of both the device structures in FIG. 1A and FIG. 1B over the conventional super-junction trench MOSFET only pronounces at the bias voltage ranging under 200V, which means that, the conventional super-junction trench MOSFET has a lower Rds when the bias voltage is beyond 200V.

U.S. Pat. No. 7,601,597 disclosed a method to avoid the aforementioned p type column structure and the n type structure dopant re-diffusion issue, for example in an N-channel trench MOSFET as shown in FIG. 1C, by setting up the p type column formation process at a last step after all diffusion processes such as: sacrificial oxidation after trench etch, gate oxidation, P body region formation and n+ source region formation, etc. . . . have been finished.

However, the disclosed method of this prior art is not effective because that, firstly, the p type column structure is formed by growing an additional p type epitaxial layer in deep trenches etched in an n type epitaxial layer; secondly, an additional CMP (Chemical Mechanical Polishing) is required for surface planarization after the p type epitaxial layer is grown; thirdly, double trench etches are necessary (one for shallow trenches for trenched gates formation and another for the deep trenches for the p type column structure formation), all the increased cost is not conductive to mass production. Moreover, other factors such as: the charges imbalance caused by the trapped charges within the column structure is still not resolved.

Therefore, there is still a need in the art of the semiconductor power device, particularly for super-junction trench MOSFET design and fabrication, to provide a novel cell structure, device configuration that would resolve these difficulties and design limitations.

SUMMARY OF THE INVENTION

The present invention provides a super-junction trench MOSFET with resurf stepped oxides (RSO) having additional freedom for better performance optimization and manufacturing capability by tuning a thick oxide thickness to minimize influence of the charges imbalance, trapped charges, etc. Therefore, the present invention only requires one kind gate trenches and a single epitaxial layer to achieve a better cost effective than the prior arts. Moreover, the present invention also provides split gate electrodes in a super-junction trench MOSFET.

In one aspect, the present invention features a super-junction trench MOSFET comprising: a substrate of a first conductivity type; an epitaxial layer of the first conductivity type onto the substrate, wherein the epitaxial layer has a lower doping concentration than the substrate; a plurality of gate trenches starting from a top surface of the epitaxial layer and extending downward into the epitaxial layer, each of the gate trenches being padded by a first insulation layer along lower portions of trench sidewalls and padded by a second insulation layer along upper portions of the trench sidewalls, wherein the first insulation layer has a greater thickness than the second insulation layer; a source electrode is formed within each of the gate trenched and surrounded by the first insulation layer in the lower portion of each of the gate trenches; the second insulation layer is formed at least along upper sidewalls of the source electrode; a pair of split gate electrodes are disposed in the upper portion of each of the gate trenches, wherein each of the split gate electrodes is formed between the source electrode and adjacent trench sidewall of the gate trenches and surrounded with the second insulation layer; a plurality of mesas between two adjacent gate trenches; a plurality of first doped column regions of a second conductivity type formed in the mesas; a plurality of second doped column regions of the first conductivity type formed in the mesas and adjacent to sidewalls of the gate trenches, located in parallel and surrounding the first doped column regions; the split gate electrodes having bottoms interfaced with the first insulation layer and having sidewalls interfaced with the second insulation layer; the source electrode is disposed between the split gate electrodes and extending deeper than the split gate electrodes in each of the gate trenches, the source electrode having a lower portion which is underneath the split gate electrodes and interfaced with the first insulation layer, and having an upper portion adjacent to the split gate electrodes and interfaced with the second insulation layer; a plurality of body regions of the second conductivity type formed in the mesas and adjacent to the split gate electrodes, covering a top surface of the first doped column regions and the second doped column regions between two adjacent gate trenches; a plurality of source regions of the first conductivity type formed in the mesas in an active area and having a higher doping concentration than the epitaxial layer, the source regions located formed on top surface of the body regions and adjacent to the split gate electrodes in an active area; and a plurality of trenched source-body contacts each filled with a contact metal plug, penetrating through the source regions and extending into the body regions.

Preferred embodiments include one or more of the following features: the gate trenches each having a trench bottom above the substrate, and underneath a bottom surface of each of the first doped column regions and the second doped column regions; the gate trenches each having a trench bottom further extending into the substrate, and the first doped column regions and the second doped column regions each having a bottom surface reaching the substrate; the source electrode in each of the gate trenches being connected to a source metal through a trenched source electrode contact filled with the contact metal plug; the gate trenches further extending to a gate contact trench which has a same filling-in structure as the gate trenches in the active area comprising the source electrodes and the split gate electrodes padded with the first and second insulation layers, wherein the split gate electrodes in the gate contact trench are connected to a gate metal through a trenched gate contact filled with the contact metal plug; the contact metal plug is a tungsten metal layer padded by a barrier metal layer of Ti/TiN or Co/TiN or Ta/TiN; the contact metal plug is Al alloys or Cu padded by a barrier metal layer of Ti/TiN or Co/TiN or Ta/TiN, wherein the contact metal plug is also extended onto a contact interlayer to respectively formed as a source metal or a gate metal; the present invention further comprising a plurality of body contact doped regions of the second conductivity type within the body regions and surrounding at least bottoms of the trenched source-body contacts underneath the source regions, wherein the body contact doped regions have a higher doping concentration than the body regions; the present invention further comprising a termination area which comprises a guard ring connected to the source regions and multiple floating guard rings having floating voltage, wherein the guard ring and the multiple floating guard rings have junction depths greater than the body regions; the present invention further comprising a termination area which comprises multiple floating trenched gates having floating voltage and being spaced apart by mesas comprising the body regions and the first and second doped column regions same as in the active area, wherein the floating trenched gates each having a filling-in electrode structure the same as in the gate trenches in the active area; the present invention further comprising a termination area which comprises multiple floating trenched gates having floating voltage and being spaced apart by mesas without comprising the body regions but having the first and second doped column regions, wherein the floating trenched gates each having a filling-in electrode structure the same as in the gate trenches; the source regions have a uniform doping concentration and junction depth between sidewalls of the trenched source-body contacts to adjacent channel regions near the gate trenches; the source regions have a higher doping concentration and a greater junction depth along sidewalls of the trenched source-body contacts than along adjacent channel regions near the gate trenches, and the source regions have a Gaussian-distribution doping profile from the sidewalls of the trenched source-body contacts to the adjacent channel regions; the first conductivity type is N type and the second conductivity type is P type; the first conductivity type is P type and the second conductivity type is N type.

The invention also features a method for manufacturing a super-junction trench MOSFET comprising the steps of: (a) growing an epitaxial layer of a first conductivity type upon a substrate of the first conductivity type, wherein the epitaxial layer has a lower doping concentration than the substrate; (b) forming a block layer onto a top surface of the epitaxial layer; (c) applying a trench mask on the block layer; (d) forming a plurality of gate trenches, and mesas between adjacent gate trenches in the epitaxial layer by etching through open regions in the block layer; (e) keeping the block layer substantially covering the mesas after formation of the trenches to block sequential angle ion implantation into top surfaces of the mesas; (f) carrying out an angle Ion Implantation of a second conductivity type dopant into the mesas through the open regions in the block layer to form a plurality of first doped column regions in the mesas and adjacent to sidewalls of the gate trenches; (g) carrying out an angle Ion Implantation of the first conductivity type dopant into the mesas through the open regions in the block layer to form a plurality of second doped column regions adjacent to the sidewalls of the gate trenches and in parallel with the first doped column regions; (h) diffusing both the first conductivity type dopant and the second conductivity type dopant into the mesas simultaneously to respectively form the first doped column regions between two adjacent gate trenches, and the second doped column regions adjacent to the sidewalls of the gate trenches an in parallel surrounding the first doped column regions; (i) forming a thick oxide layer along inner surfaces of the gate trenches by thermal oxide growth or oxide deposition; (j) depositing a first doped poly-silicon layer filling the gate trenches to serve as source electrodes; (k) etching back the source electrodes from the top surface of the epitaxial layer (l) etching back the thick oxide layer from an upper portion of the gate trenches; (m) forming a thin oxide layer covering a top surface of the thick oxide layer, along upper inner surfaces of the gate trenches and along upper sidewalls of the source electrodes above the top surface of the thick oxide layer; (n) depositing a second doped poly-silicon layer filling the upper portion of the gate trenches surrounded with the thin oxide layer to serve as split gate electrodes; (o) etching back the split gate electrodes by CMP (Chemical Mechanical Polishing) or plasma etch; (p) carrying out a body implantation of the second conductivity type dopant and a step of body diffusion to form body regions; (q) applying a source mask onto the top surface of the epitaxial layer; and (r) carrying out a source implantation of the first conductivity type dopant and a source diffusion to form source regions.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
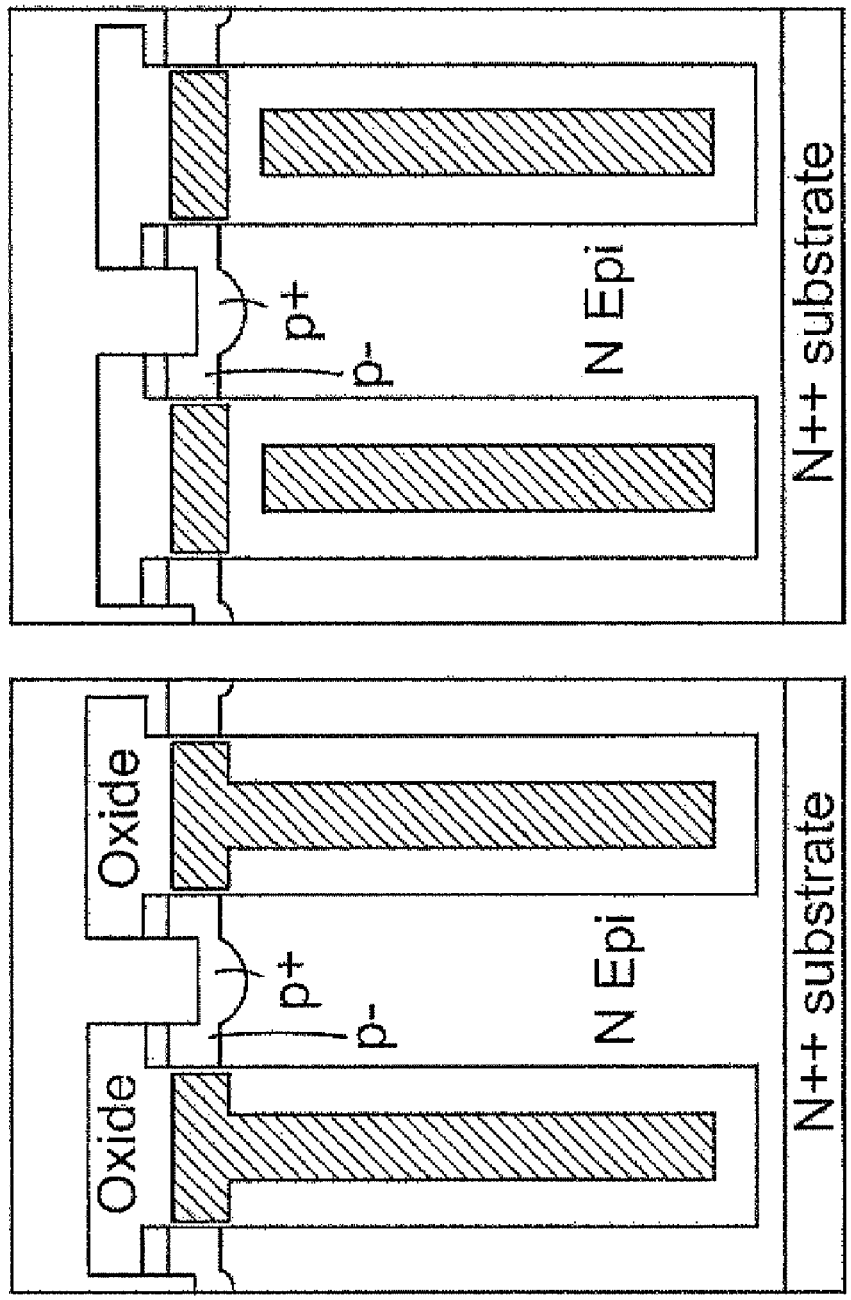
FIG. 1A is a cross-sectional view of a trench MOSFET of a prior art.
Figure 1B:
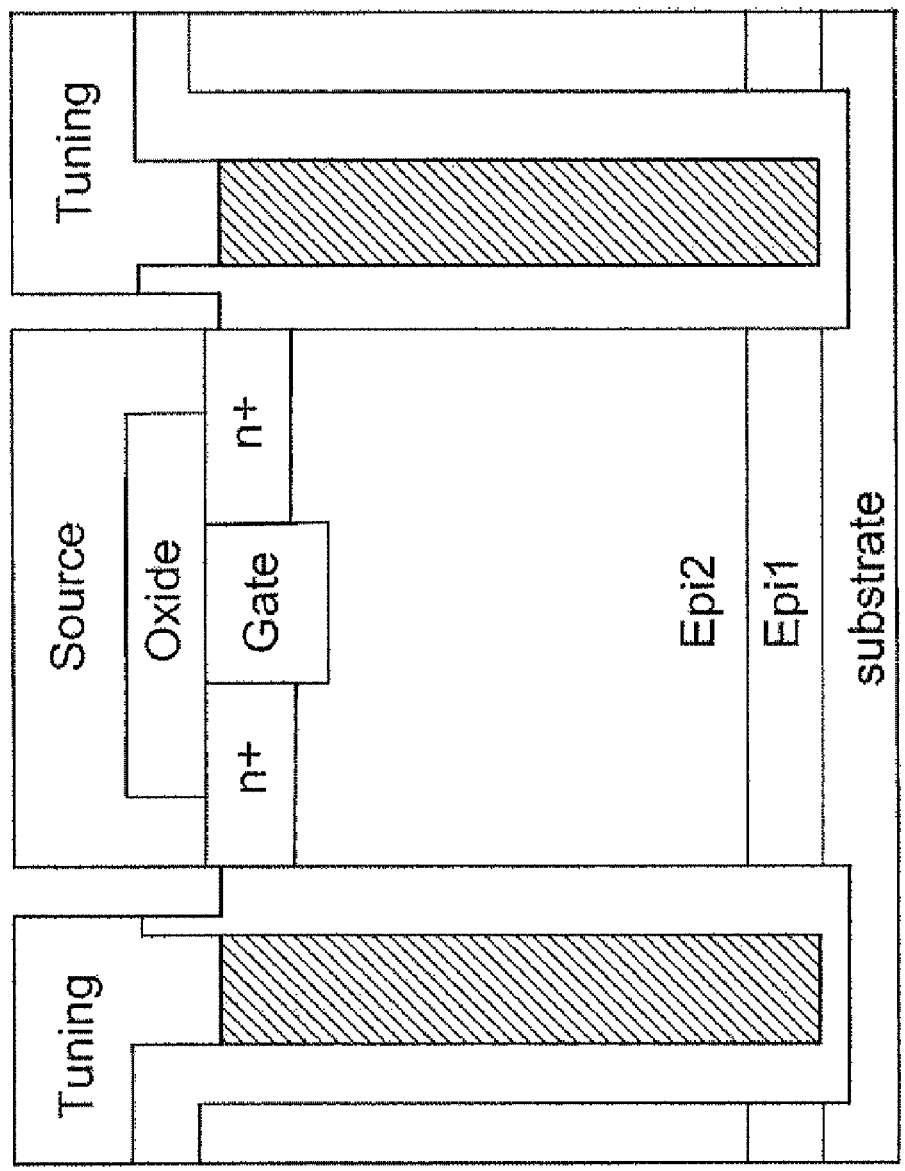
FIG. 1B is a cross-sectional view of a trench MOSFET of another prior art.
Figure 1C:
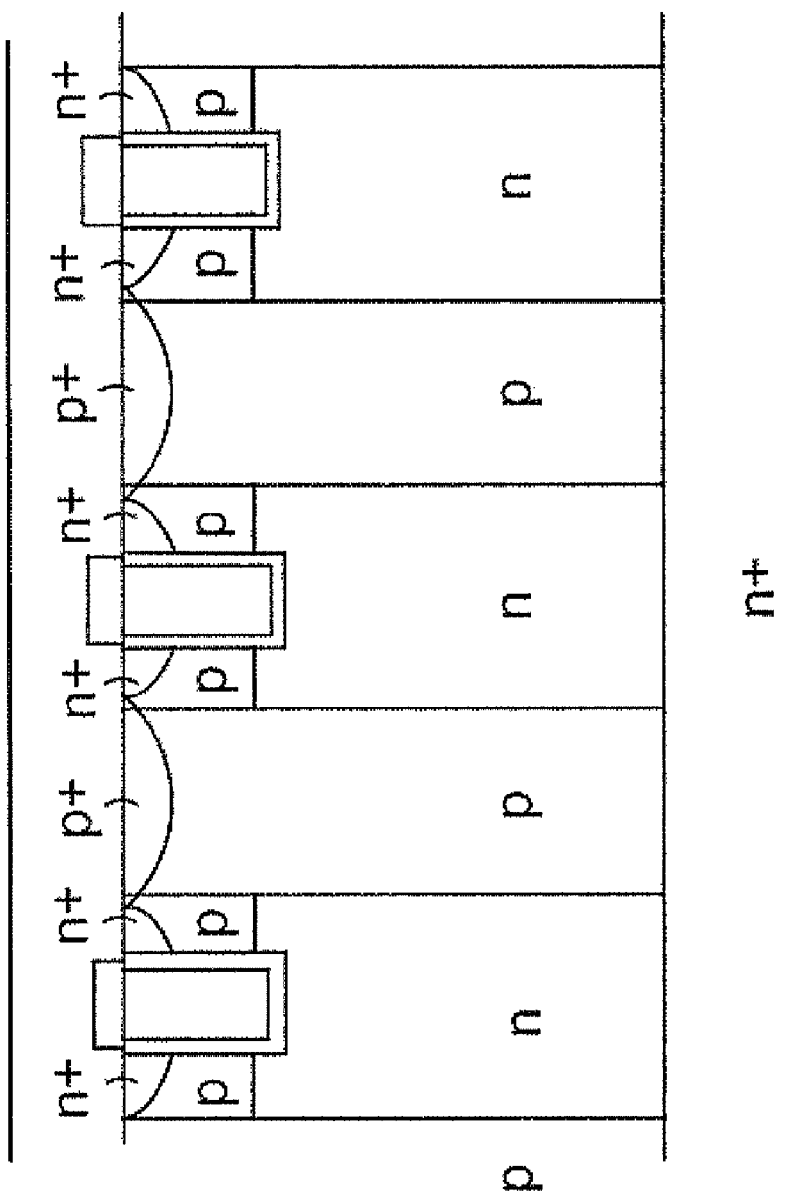
FIG. 1C is a cross-sectional view of a super-junction trench MOSFET of another prior art.
Figure 2A:
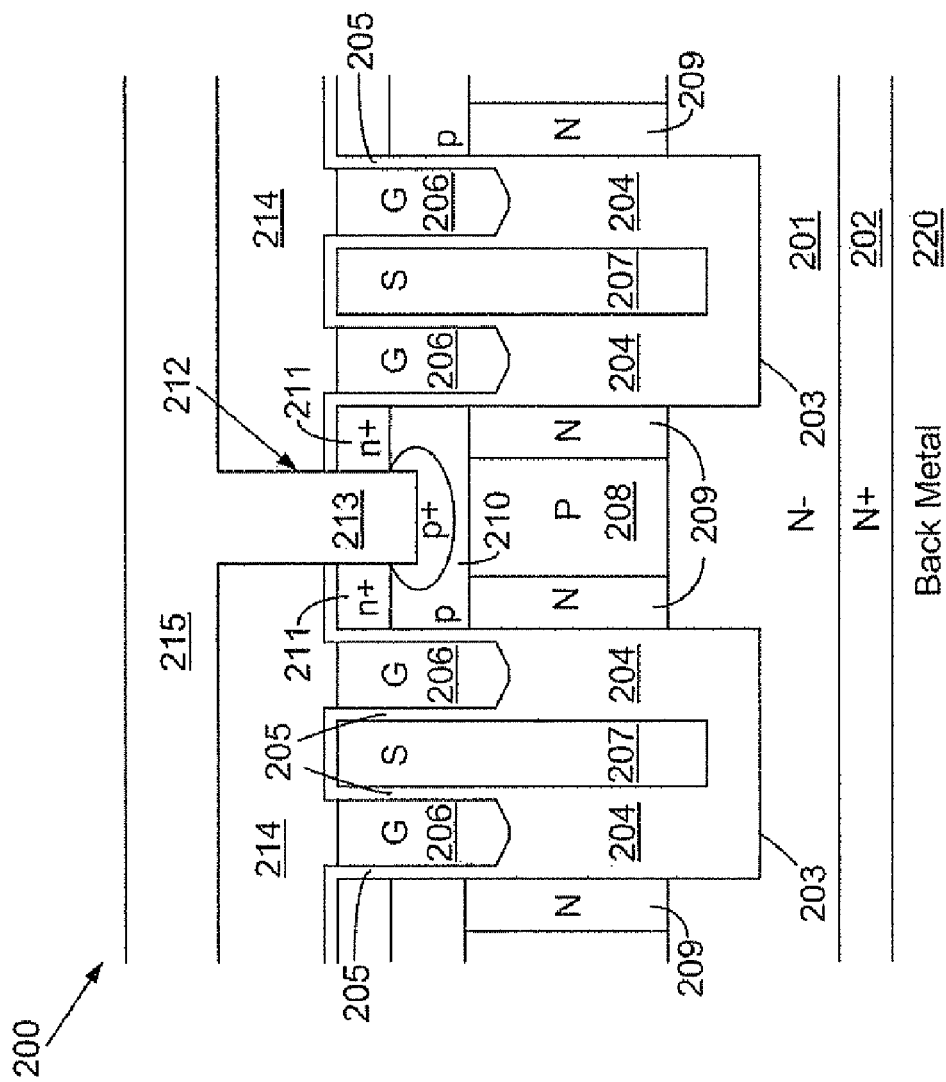
FIG. 2A is a cross-sectional view of a preferred embodiment according to the present invention.

Please refer to FIG. 2A for a preferred embodiment of this invention where an N-channel super-junction trench MOSFET 200 is formed in an N− epitaxial layer 201 onto an N+ substrate 202 coated with a back metal of Ti/Ni/Ag on a rear side as a drain metal 220. A plurality of gate trenches 203 are formed starting from a top surface of the N− epitaxial layer 201 and extending downward into the N− epitaxial layer 201, wherein trench bottoms of the gate trenches 203 are above a common interface between the N+ substrate 202 and the N− epitaxial layer 201. Each of the gate trenches 203 is lined by a first insulation layer 204 along a lower inner surface and lined by a second insulation layer 205 along an upper inner surface, wherein the first insulation layer 204 has a greater thickness than the second insulation layer 205. Split gate electrodes 206 (G, as illustrated) are formed along the upper inner surface of each of the gate trenches 203, having sidewalls surrounded by the second insulation layer 205 and having a bottom interfaced with the first insulation layer 204. A source electrode 207 (S, as illustrated) is formed between the split gate electrodes 206 within each of the gate trenches 203, the source electrode 207 has a lower portion underneath the split gate electrodes 206 surrounded by the first insulation layer 204, the source electrode 207 has an upper portion adjacent to the split gate electrodes 206 and surrounded by the second insulation layer 205, wherein the split gate electrodes 206 each is formed in the middle between the source electrode 207 and the upper inner surface of each of the gate trenches 203. Both the split gate electrode 206 and the source electrode 207 can be implemented by using doped poly-silicon layer. A plurality of mesas is located between two adjacent gate trenches 203. A P type first doped column region 208 is formed in each of the mesas and a pair of N type second doped column regions 209 are formed adjacent to sidewalls of the gate trenches 203 and surround in parallel the P type second doped column region 208. Onto a top surface of the N type second doped column regions 209 and the P type first doped column regions 208 in the mesas, p body regions 210 are formed covered by n+ source regions 211 in an active area and adjacent to the split gate electrodes 206. A plurality of trenched source-body contacts 212 each filled with a contact metal plug 213 are penetrating through a contact interlayer 214, the n+ source regions 211 in the active area and extending into the p body region 210, wherein the contact metal plug 213 is Al alloys or Cu padded by a barrier metal layer of Ti/TiN or Co/TiN or Ta/TiN, the contact metal plug 213 is also extended onto the contact interlayer 214 to be formed as a source metal 215 which is connected to the n+ source regions 211 and the p body region 210. The n+ source regions 211 have a uniform doping concentration and junction depth between sidewalls of the trenched source-body contacts 212 to adjacent channel regions near the gate trenches 203. A p+ body contact doped region 216 is formed surrounding at least bottom of each of the trenched source-body contacts 212 to reduce the contact resistance between the p body regions 210 and the contact metal plug 213.

Figure 2B:
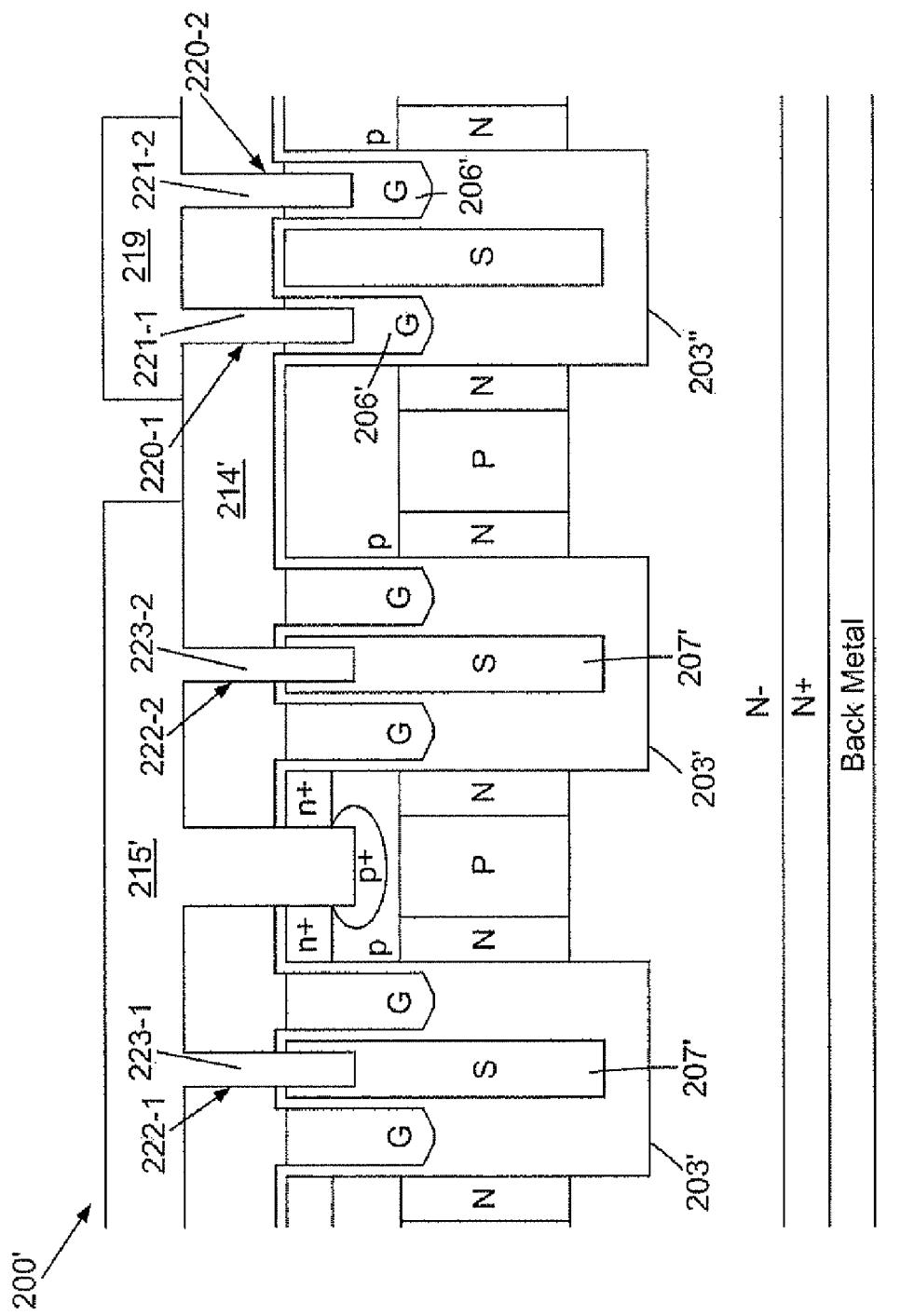
FIG. 2B is another cross-sectional view of the preferred embodiment according to the present invention.

FIG. 2B shows a cross-sectional view of another trench MOSFET 200' according to the present invention. The trench MOSFET 200' has a similar structure as the trench MOSFET 200 in the active area, except that, the source electrode 207' in each of the gate trenches 203' is connected to the source metal 215' through a trenched source electrode contact (222-1 or 222-2) filled with the contact metal plug (223-1 or 223-2, which is the same as the contact metal plug 213 in FIG. 2A). Moreover, the gate trenches 203' further extend to a gate contact trench 203" which has a same filling-in electrode structure as in the gate trenches 203'. The split gate electrode 206' within the gate contact trench 203" are connected to a gate metal 219 via a trenched gate contact (220-1 or 220-2) filled with the contact metal plug (221-1 or 221-2, which is the same as the contact metal plug 213) for gate connection. In this embodiment, the contact metal plugs 223-1 and 223-2 are extending over the contact interlayer 214' to be formed as the source metal 215', the contact metal plugs 221-1 and 221-2 are extending over the contact interlayer 214' to be formed as the gate metal 219.

Figure 3:
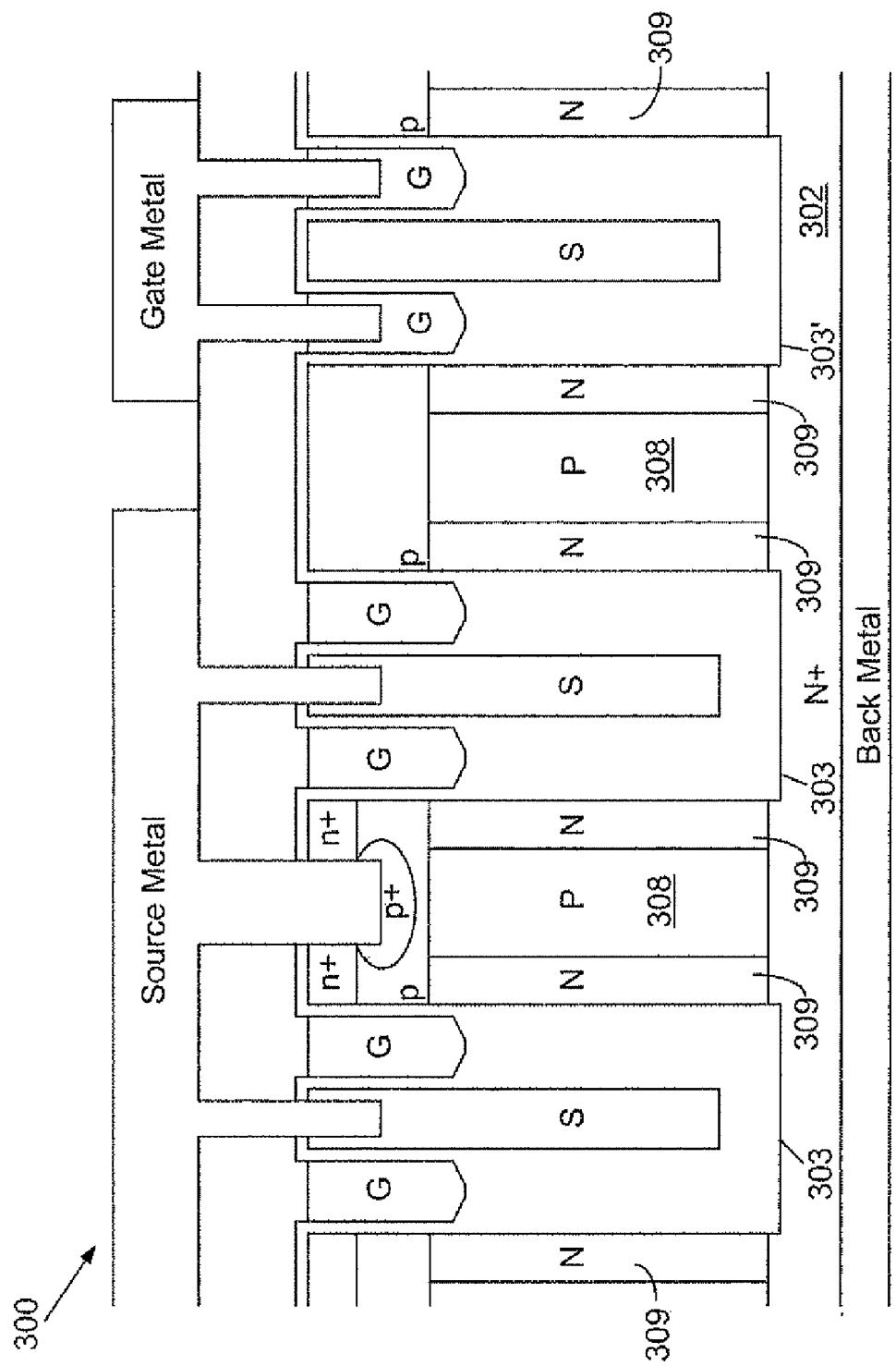
FIG. 3 is a cross-sectional view of another preferred embodiment according to the present invention.

FIG. 3 is a cross-sectional view of another preferred embodiment according to the present invention. N-channel trench MOSFET 300 in FIG. 3 is similar to the trench MOSFET 200' in FIG. 2B except that, in FIG. 3, the gate trenches 303 and the gate contact trench 303' are starting from the top surface of the epitaxial layer and further extending into the N+ substrate 302. Besides, bottoms of the N type second doped column regions 309 and the P type first doped column regions 308 are reaching the common interface between the epitaxial layer and the N+ substrate 302.

Figure 4:
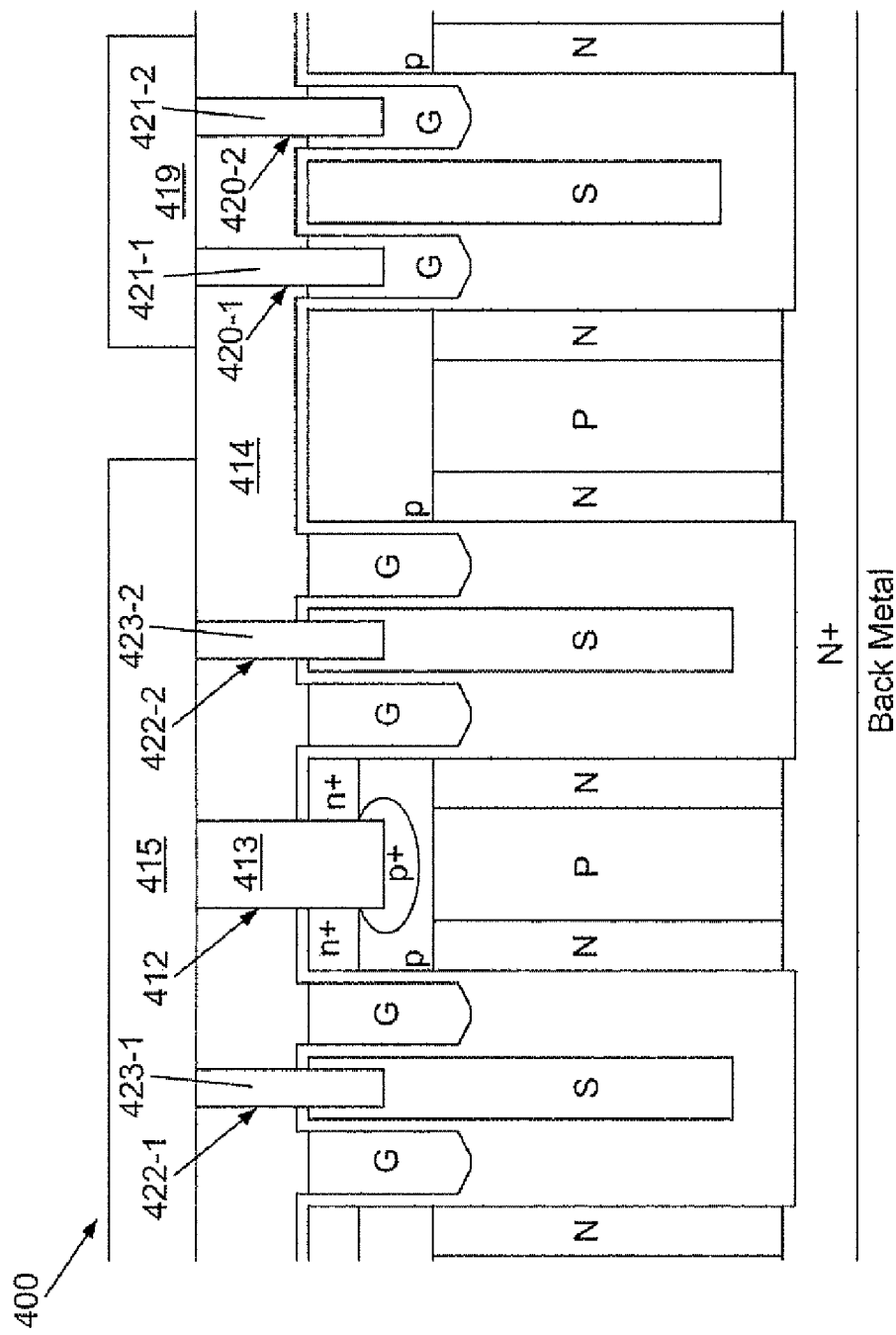
FIG. 4 is a cross-sectional view of another preferred embodiment according to the present invention.

FIG. 4 is a cross-sectional view of another preferred embodiment according to the present invention. N-channel trench MOSFET 400 in FIG. 4 is similar to the trench MOSFET 300 in FIG. 3 except that, in FIG. 4, the contact metal plugs (423-1 and 423-2) filled in the trenched source electrode contacts (422-1 and 422-2), the contact metal plug 413 filled in the trenched source-body contact 412, and the contact metal plugs (421-1 and 421-2) filled in the trenched gate contacts (420-1 and 420-2) are a tungsten metal layer padded by a barrier metal layer of Ti/TiN or Co/TiN or Ta/TiN. Moreover, the source metal 415 and the gate metal 419 extending over the contact interlayer 414 are padded by a resistance-reduction layer Ti or Ti/TiN (not shown) underneath to reduce the contact resistance between the source metal 415 and the contact metal plugs (413, 423-1 and 423-2), between the gate metal 419 and the contact metal plugs (421-1 and 421-2).

Figure 5A:
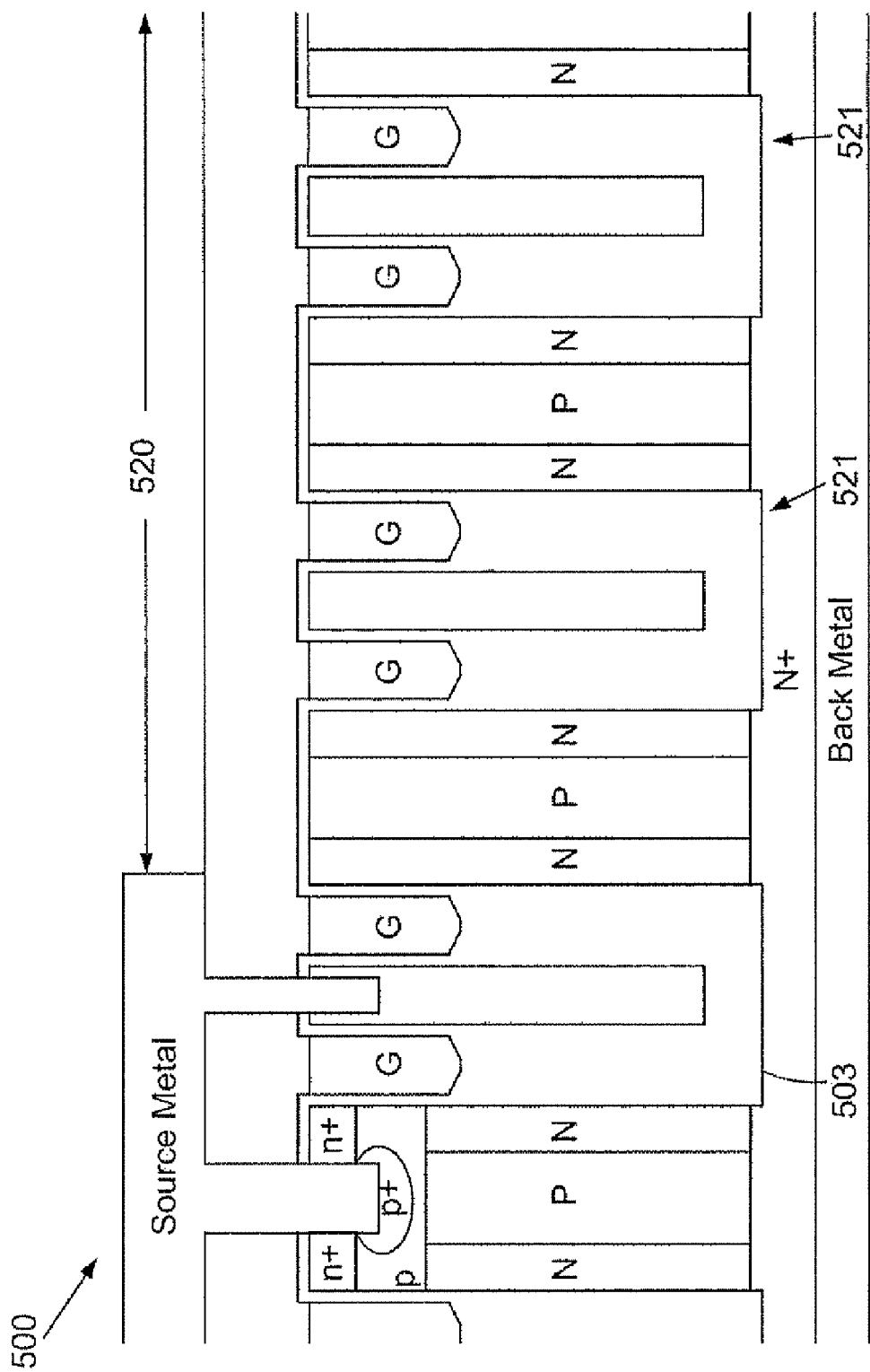
FIG. 5A is a cross-sectional view of another preferred embodiment according to the present invention.

FIG. 5A shows a cross-sectional view of another preferred embodiment according to the present invention which has a similar structure in the active area with the trench MOSFET 300 in FIG. 3, N-channel trench MOSFET 500 in FIG. 5A further comprises multiple floating trenched gates 521 being spaced apart by a plurality of mesas without having body regions between them in a termination area 520, wherein the multiple floating trenched gates 521 having a floating voltage have a same filling-in electrode structure as in the gate trenches 503 in the active area.

Figure 5B:
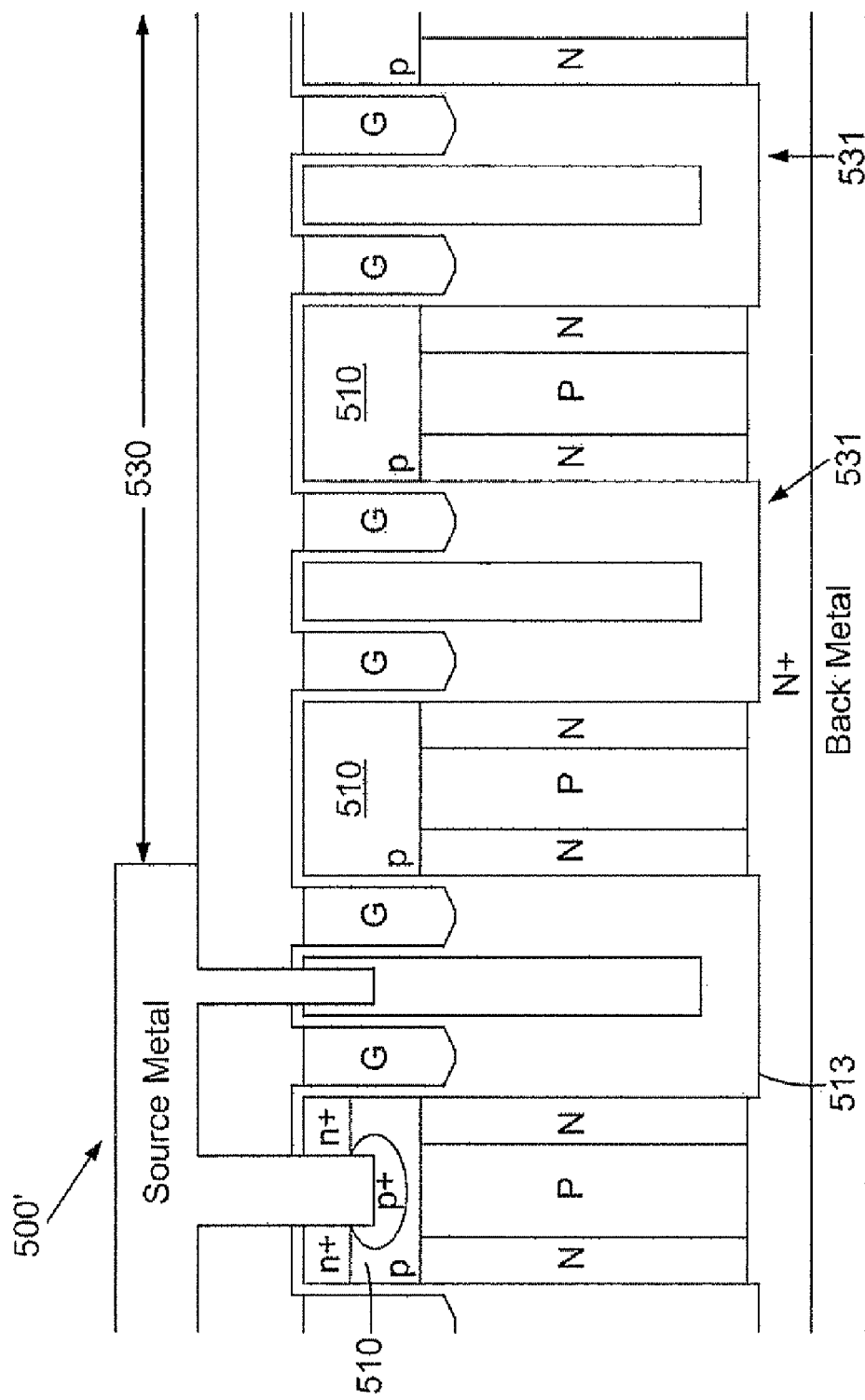
FIG. 5B is a cross-sectional view of another preferred embodiment according to the present invention.

FIG. 5B shows a cross-sectional view of another preferred embodiment according to the present invention which has a similar structure in the active area with the trench MOSFET 300 in FIG. 3, N-channel trench MOSFET 500' in FIG. 5B further comprises multiple floating trenched gates 531 being spaced apart by a plurality of mesas having the p body regions 510 in a termination area 530, wherein the trenched floating gates 531 having a floating voltage have a same filling-in electrode structure as in the gate trenches 513 in the active area.

Figure 5C:
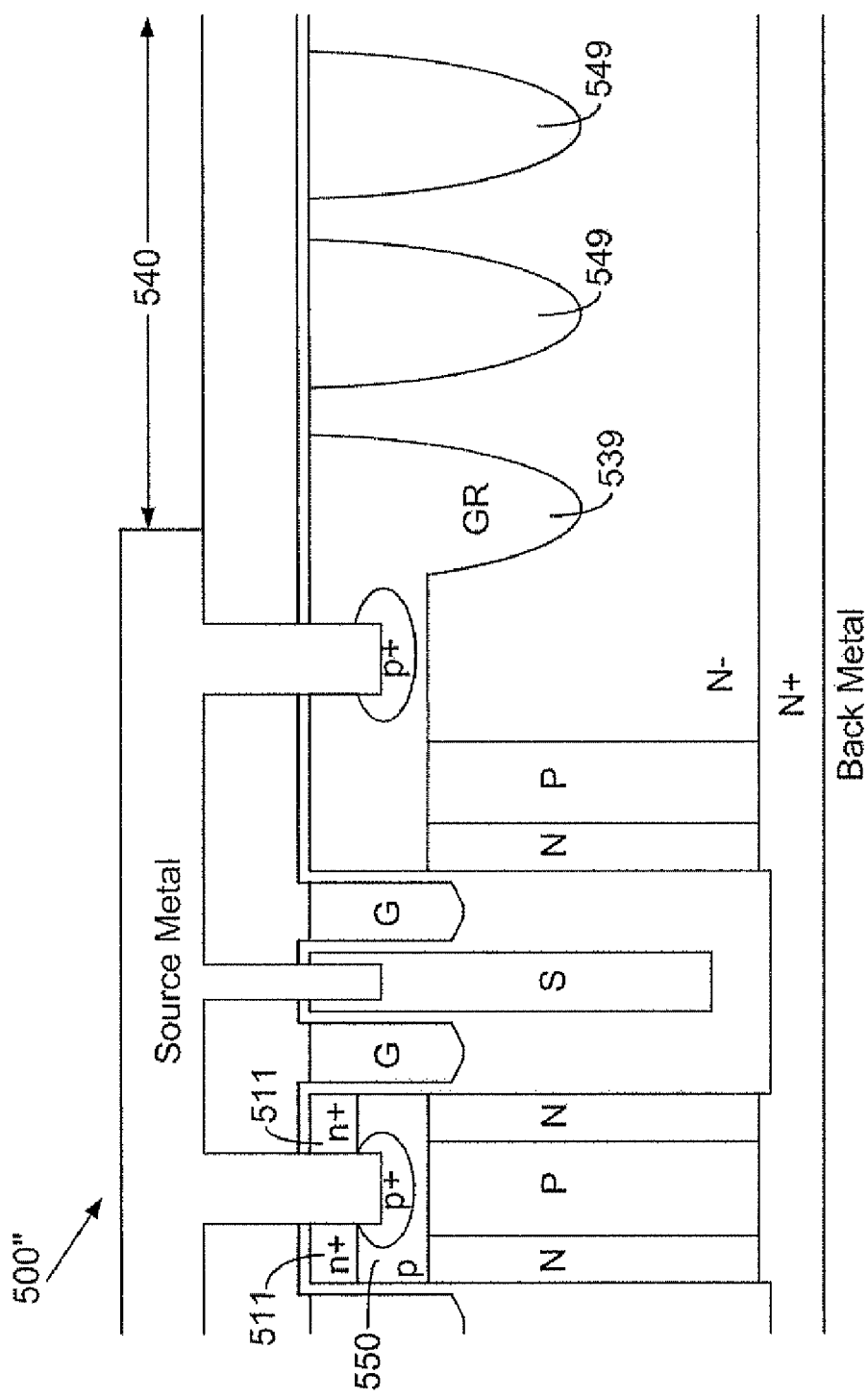
FIG. 5C is a cross-sectional view of another preferred embodiment according to the present invention.

FIG. 5C shows a cross-sectional view of another preferred embodiment according to the present invention which has a similar structure in the active area as the trench MOSFET 300 in FIG. 3, N-channel trench MOSFET 500" in FIG. 5C further comprises a guard ring 539 (GR, as illustrated in FIG. 5C) connected with the n+ source regions 511, and multiple floating guard rings 549 having floating voltage in a termination area 540, wherein the guard ring 539 and the multiple floating guard rings 549 have junction depths greater than the p body regions 550.

Figure 6:
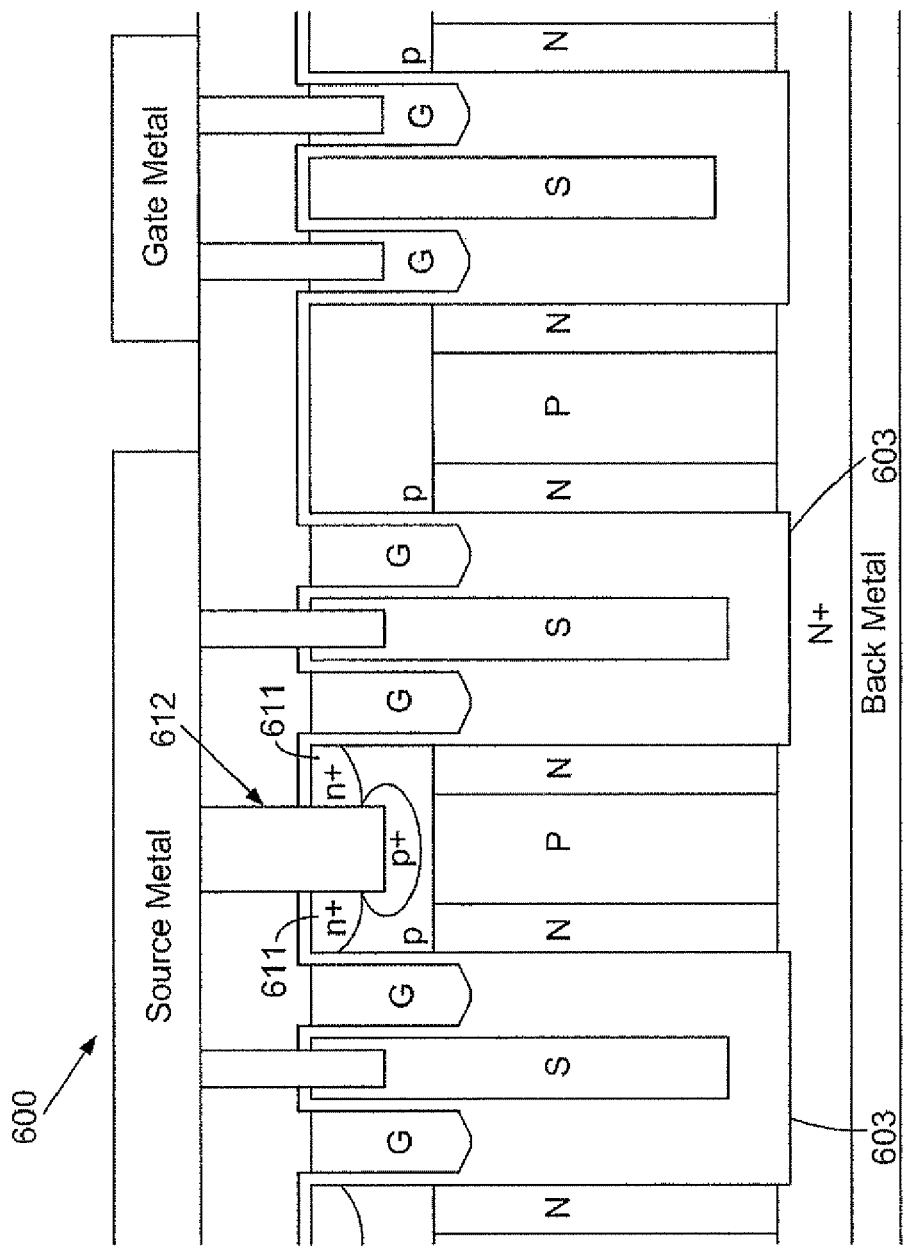
FIG. 6 is a cross-sectional view of another preferred embodiment according to the present invention.

FIG. 6 shows a cross-sectional view of another preferred embodiment according to the present invention which has a similar structure to the trench MOSFET 400 in FIG. 4 except that, in N-channel trench MOSFET 600 of FIG. 6, the n+ source regions 611 have a higher doping concentration and a greater junction depth along sidewalls of the trenched source-body contacts 612 than along adjacent channel regions near the gate trenches 603, and the n+ source regions 611 have a Gaussian-distribution doping profile from the sidewalls of the trenched source-body contacts 612 to the adjacent channel regions near the gate trenches 603.

Figure 7A:
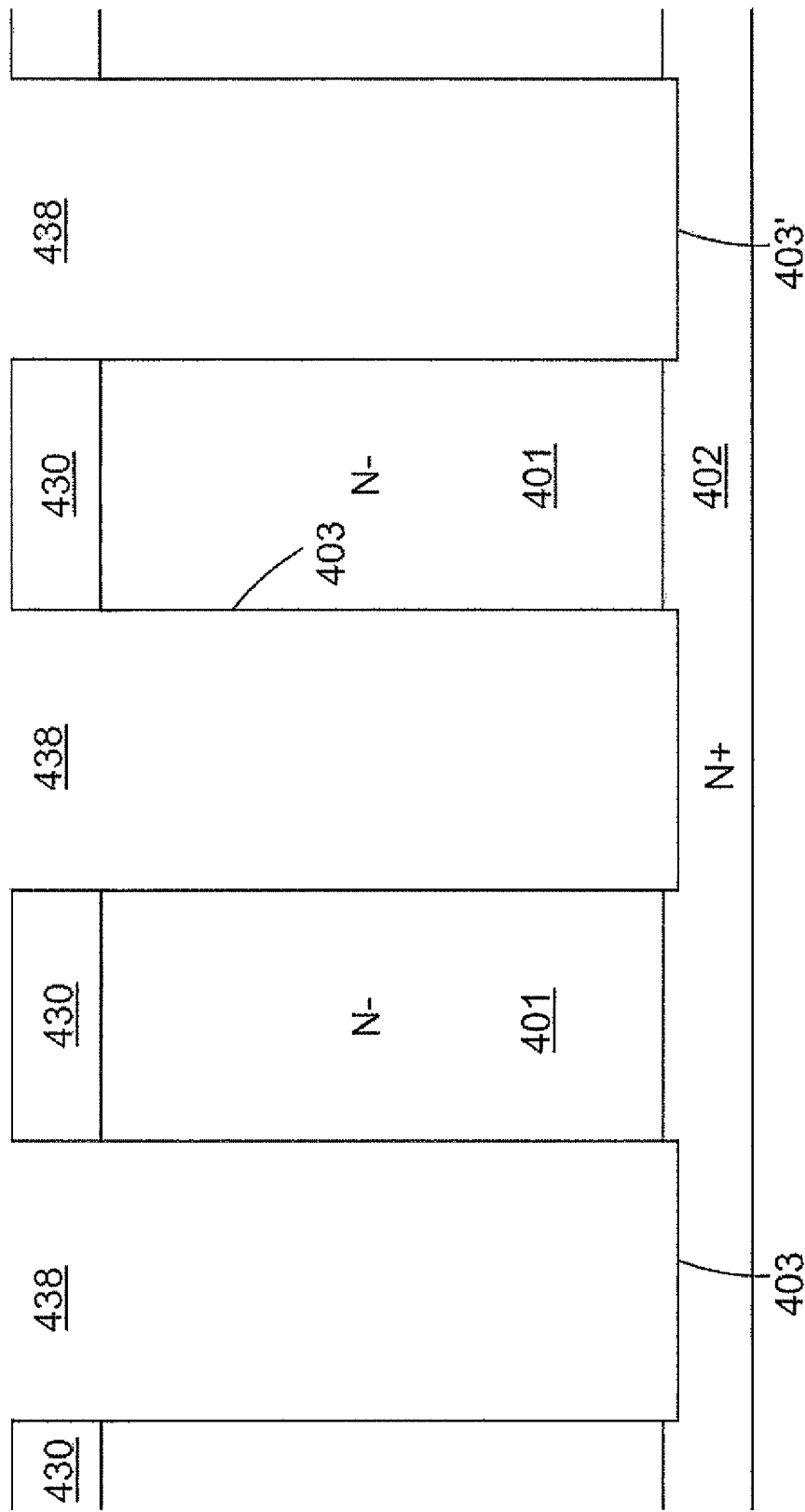
FIGS. 7A-7H are a serial of side cross-sectional views for showing the processing steps for fabricating the super-junction trench MOSFET as shown in FIG. 4.

FIGS. 7A~7H are a serial of exemplary steps that are performed to form the inventive super-junction trench MOSFET 417 in FIG. 4. FIG. 7A, an N epitaxial layer 401 is formed onto an N+ substrate 402, wherein the N+ substrate 402 has a higher doping concentration than the N epitaxial layer 401, and share a common interface with the N epitaxial layer 401. Next, a block layer 430, which can be implemented by using an oxide layer, is formed covering a top surface of the N epitaxial layer 401. Then, after a trench mask (not shown) is applied onto the block layer 430, a plurality of gate trenches 403 and at least a gate contact trench 403' are etched through open regions 438 of the block layer 430 formed by dry etch, the N epitaxial layer 401, the interface and further extending into the N+ substrate 402 by successively dry silicon etch. Meanwhile, a plurality of mesas are formed between two adjacent gate trenches 403 and the gate contact trench 403'.

Figure 7B:
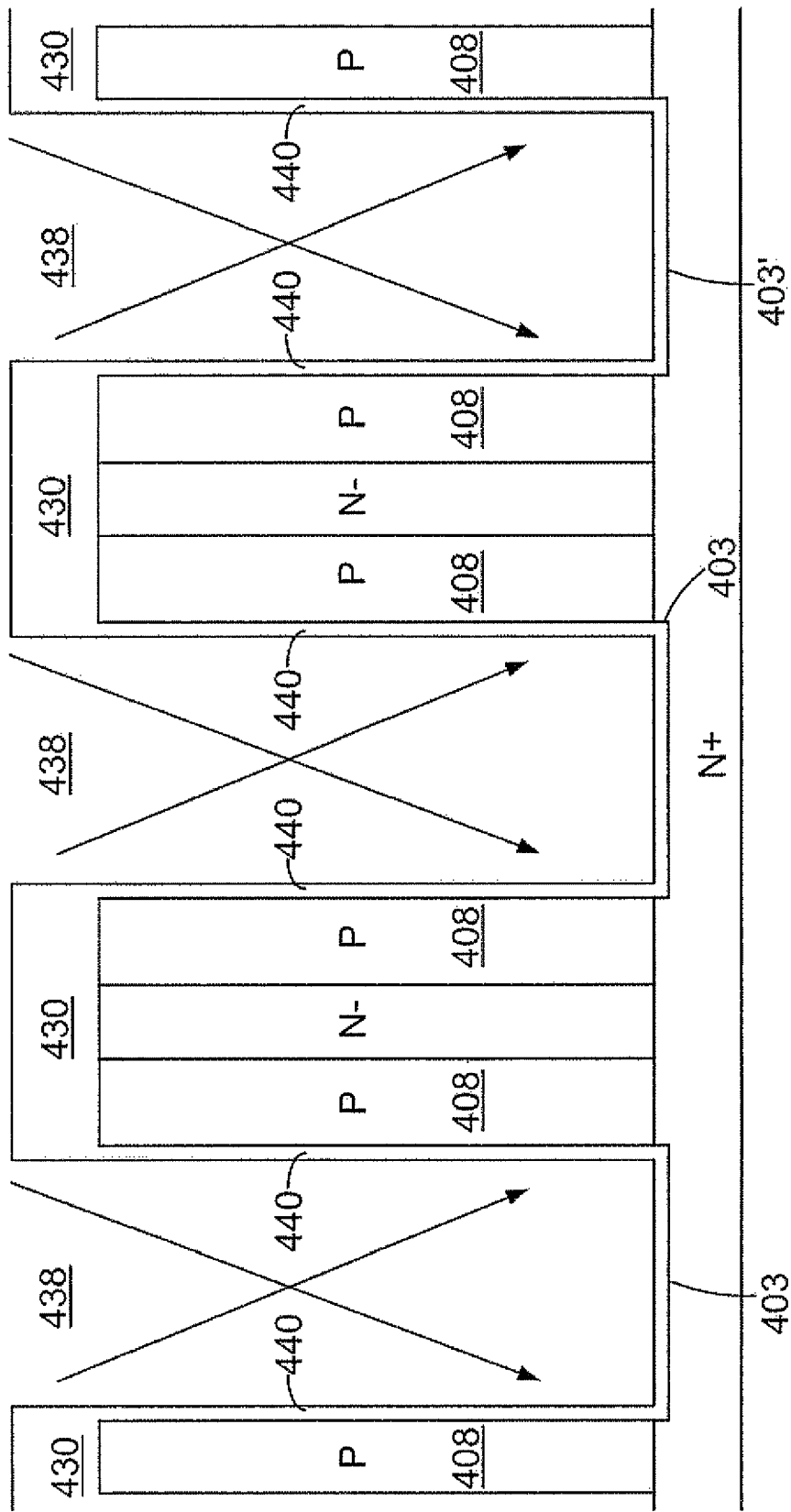

In FIG. 7B, a sacrificial oxide (not shown) is first grown and then removed to eliminate the plasma damage introduced during opening the gate trenches 403 and the gate contact trench 403'. The block layer 430 is still substantially remained on the mesas after the sacrificial oxide removed to block sequential angle ion implantations into top surfaces of the mesas. After that, a screen oxide 440 is grown along inner surfaces of the gate trenches 403 and the gate contact trench 403'. Then, an angle Ion Implantation of Boron dopant through the open regions 438 is carried out to form a plurality of P type first doped column regions 408 with column shape in the mesas and adjacent to sidewalls of the gate trenches 403 and the gate contact trench 403'.

Figure 7C:
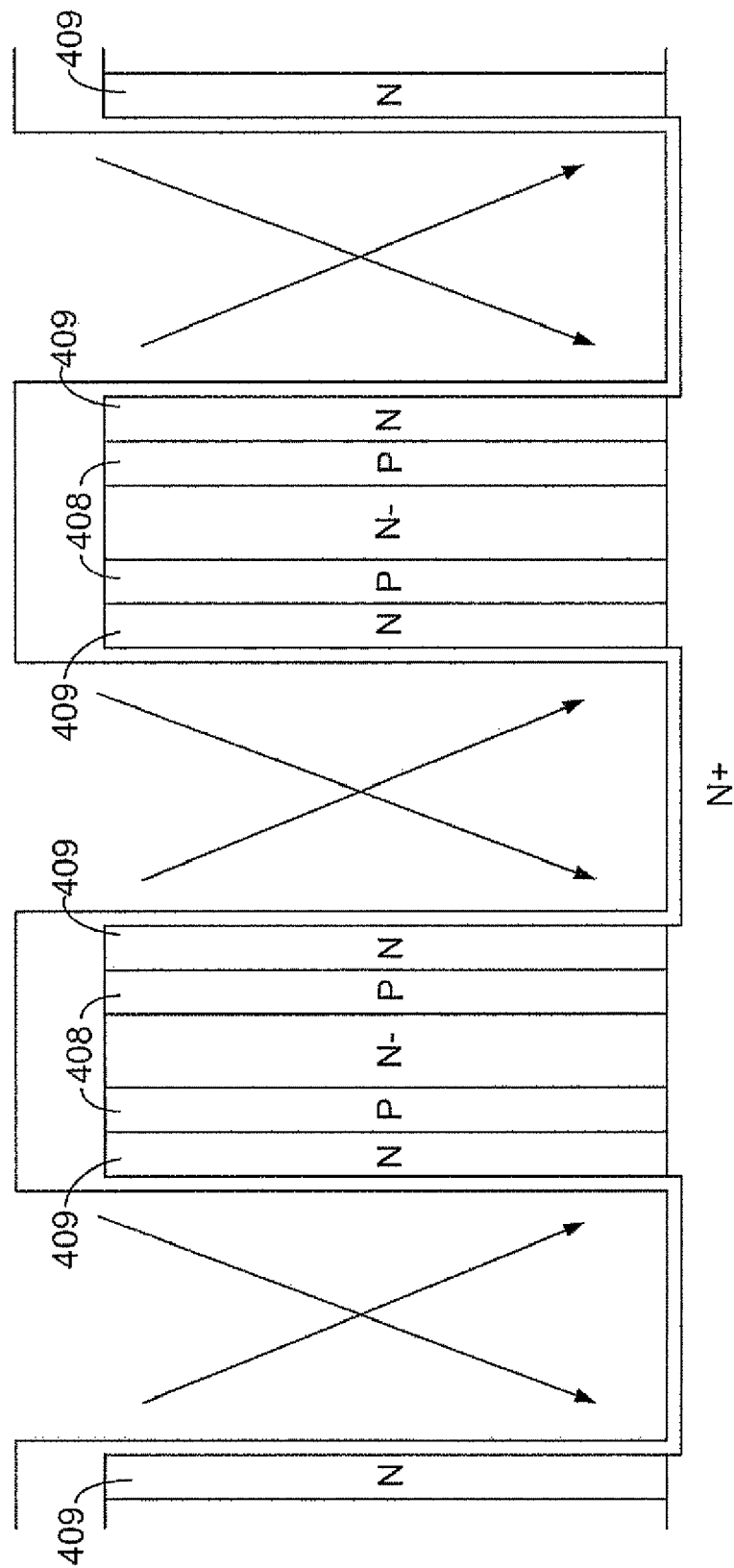

In FIG. 7C, another angle Ion Implantation of Arsenic or Phosphorus dopant is carried out to form a plurality of N type second doped column regions 409 with column shape adjacent to the sidewalls of the gate trenches and the gate contact trench, formed in parallel and surrounding the P type first doped column regions 408.

Figure 7D:
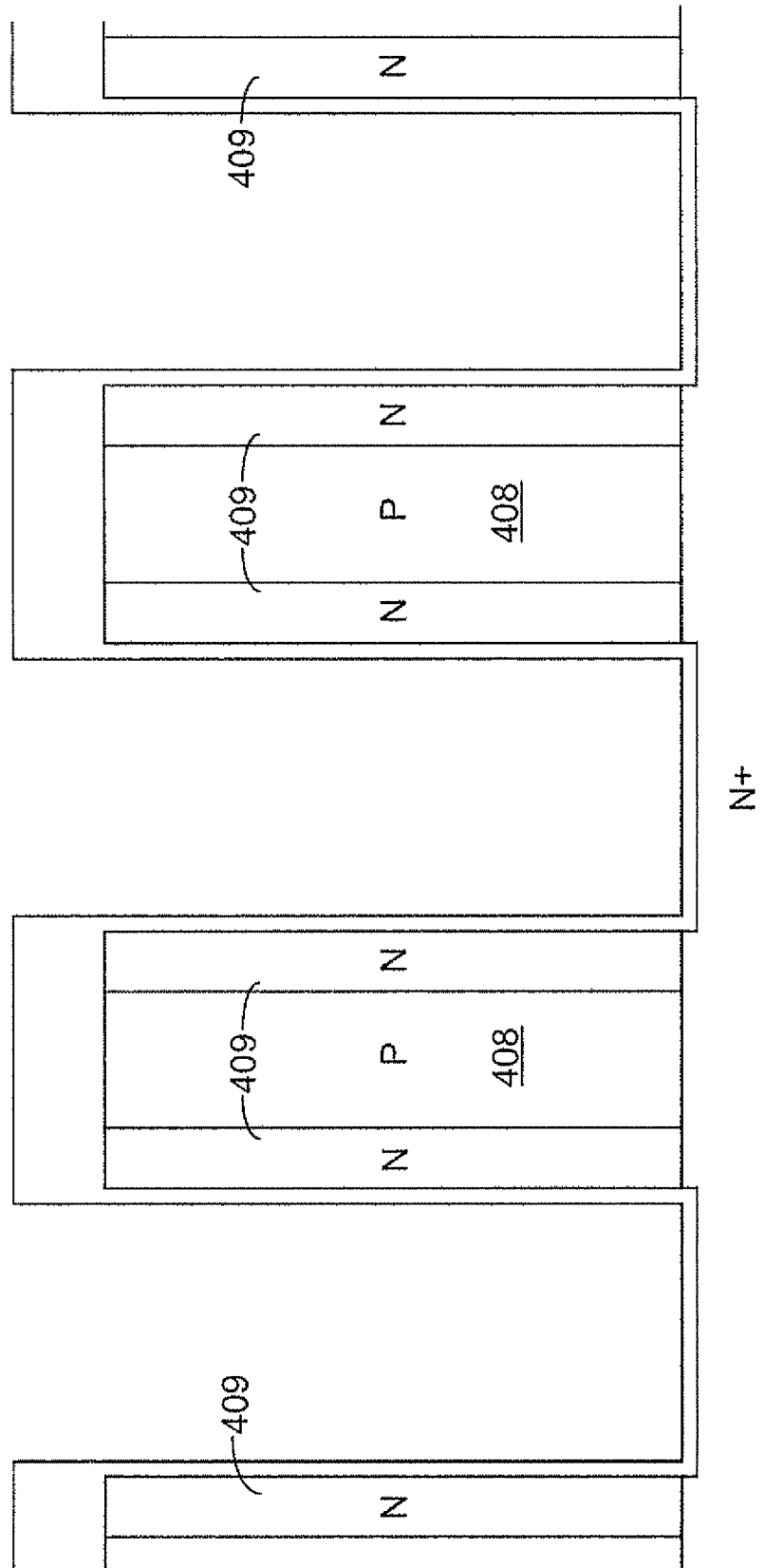

In FIG. 7D, a diffusion step for both the P type first doped column regions 408 and the N type second doped column regions 409 is carried out, therefore, the P type first doped column regions 408 and N type second doped column 409 are formed simultaneously. The P type first doped column regions 408 are diffused to be in parallel surrounded with the N type second doped column regions 409. In another preferred embodiment, an additional diffusion is carried out prior to carrying out the angle ion implantation of Arsenic and Phosphorus dopant.

Figure 7E:
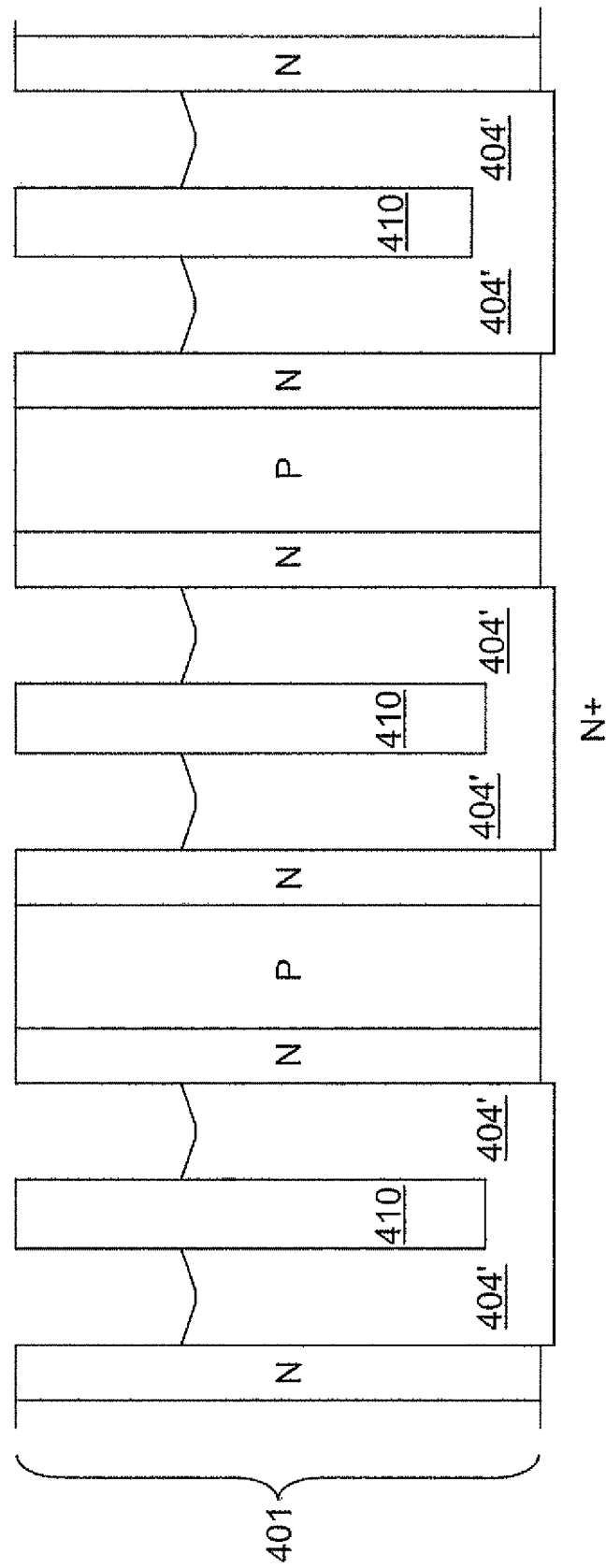

In FIG. 7E, the block layer and the screen oxide are removed away. A thick oxide layer 404' is formed lining the inner surfaces of the gate trenches and the gate contact trench by thermal oxide growth or thick oxide deposition. Then, a first doped poly-silicon layer is deposited onto the thick oxide layer 404' to fill the gate trenches and the gate contact trench and is then etched back from the top surface of the N epitaxial layer 401 to serve as a source electrode 410. Next, the thick oxide layer 404' is etched away from an upper portion of the gate trenches and the gate contact trench.

Figure 7F:
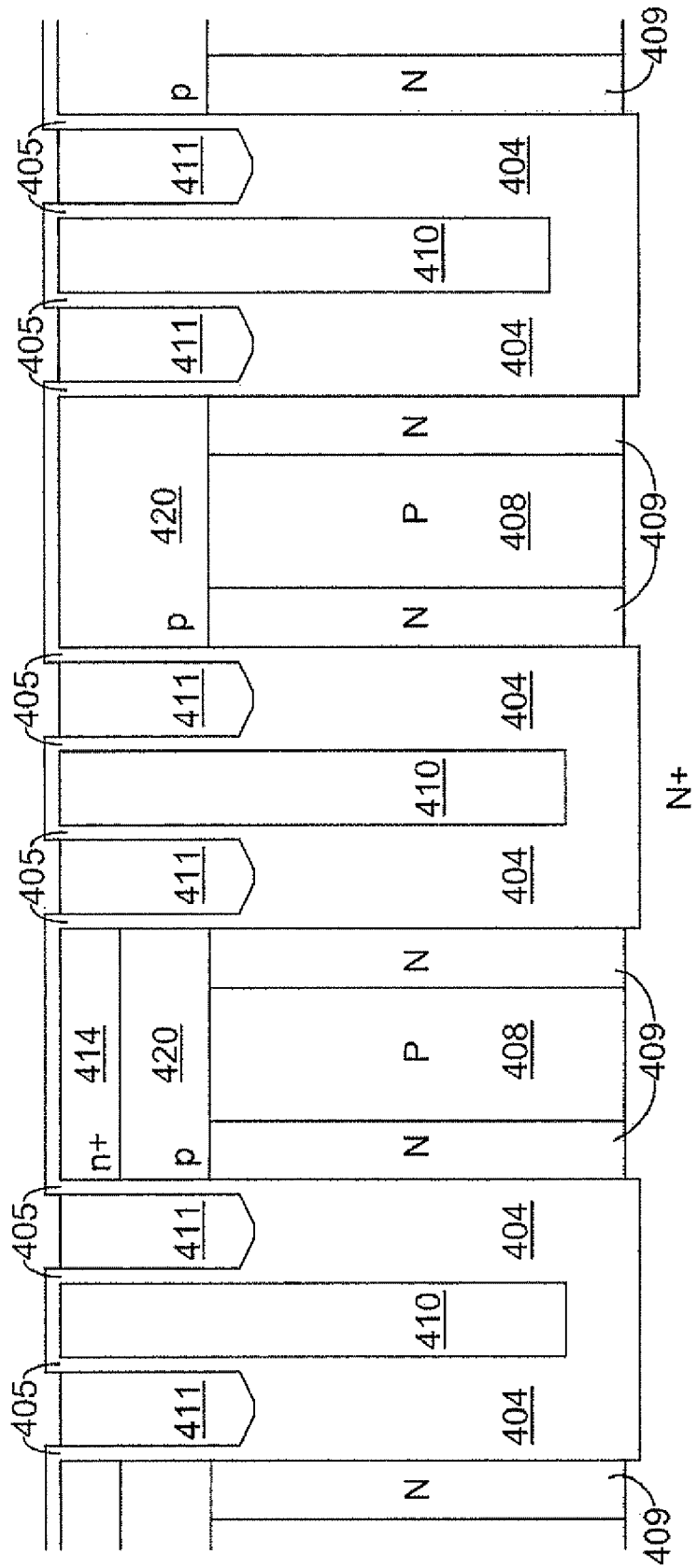

In FIG. 7F, a thin oxide layer as a gate oxide 405 is grown or deposited along upper inner surfaces of the gate trenches 403 and the gate contact trench 403', and along upper sidewalls of the source electrode 410 above the top surface of the thick oxide layer. Then, a second doped poly-silicon layer is deposited filling in between the source electrodes 410 and the adjacent sidewalls of the gate trenches and the gate contact trench, and then is etched back by CMP or plasma etch to serve as split gate electrodes 411. Therefore, the split gate electrodes 411 have trench bottoms interfaced with the first insulation layer 404 and have sidewalls interfaced with the second insulation layer 405. Then, a step of Ion Implantation with P type dopant is carried out to form p body regions 420 between two adjacent of the gate trenches and the gate contact trench, and covering the N type second doped column regions 409 and the P type first doped column regions 408. Then, after applying a source mask (not shown), a step of Ion Implantation with N type dopant is carried out to form n+ source regions 414 near a top surface of the P body regions 420 in an active area.

Figure 7G:
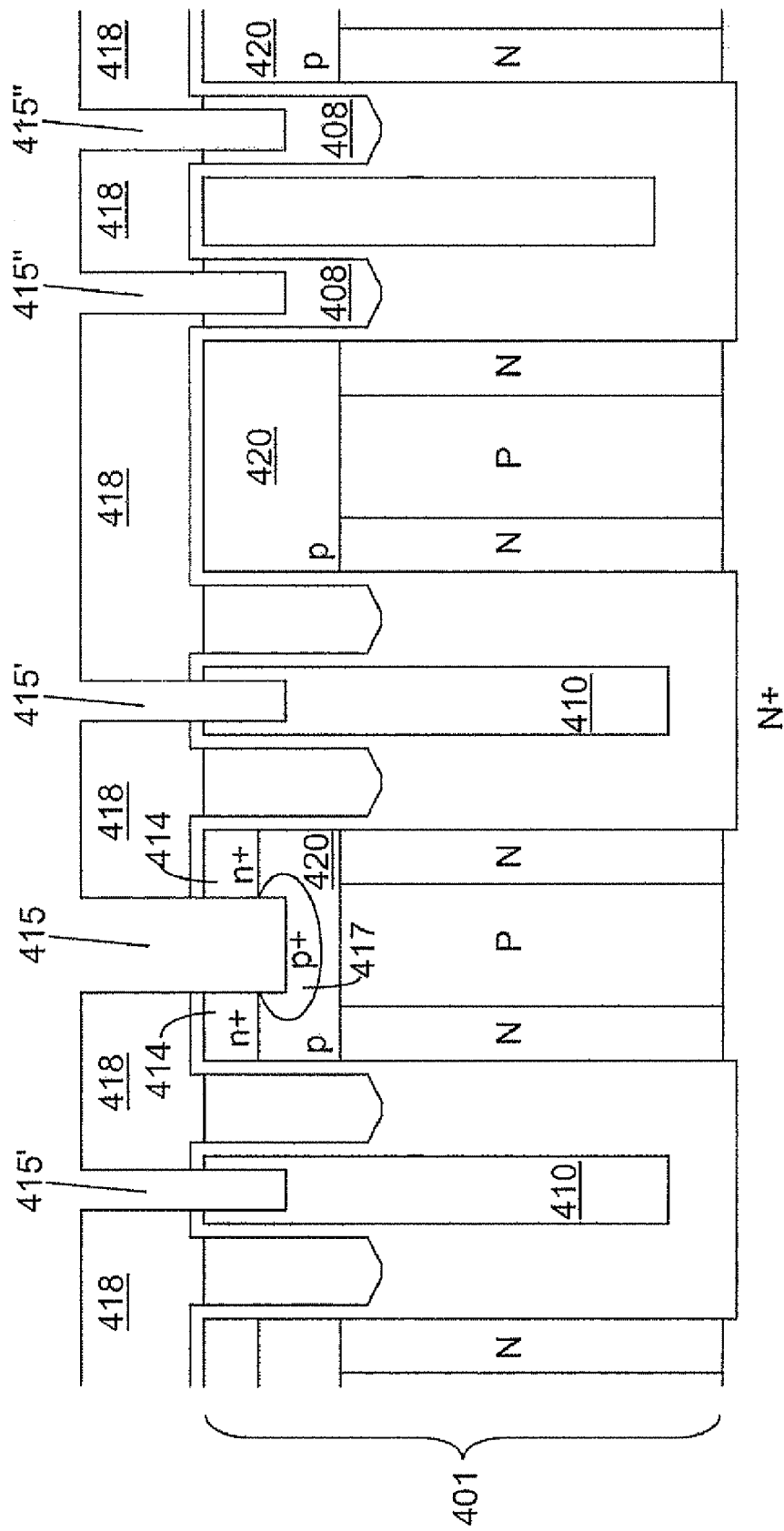

In FIG. 7G, another insulation layer is deposited onto the whole top surface of the device structure to serve as a contact interlayer 418. Then, after applying a contact mask (not shown) onto the contact interlayer 418, a plurality of contact holes are formed by successively dry oxide etch and dry silicon etch. After penetrating through the contact interlayer 418, the contact holes 415 are further penetrating through the n+ source region 414 and extending into the p body region 420 in the active area, the contact holes 415' are extending into the source electrodes 410, and the contact holes 415" are extending into the split gate electrodes 408 in the gate contact trench. Next, a BF2 Ion Implantation is performed to form a plurality of p+ body contact doped regions 417 within the p body regions 713 and surrounding at least bottoms of the contact holes 415.

Figure 7H:
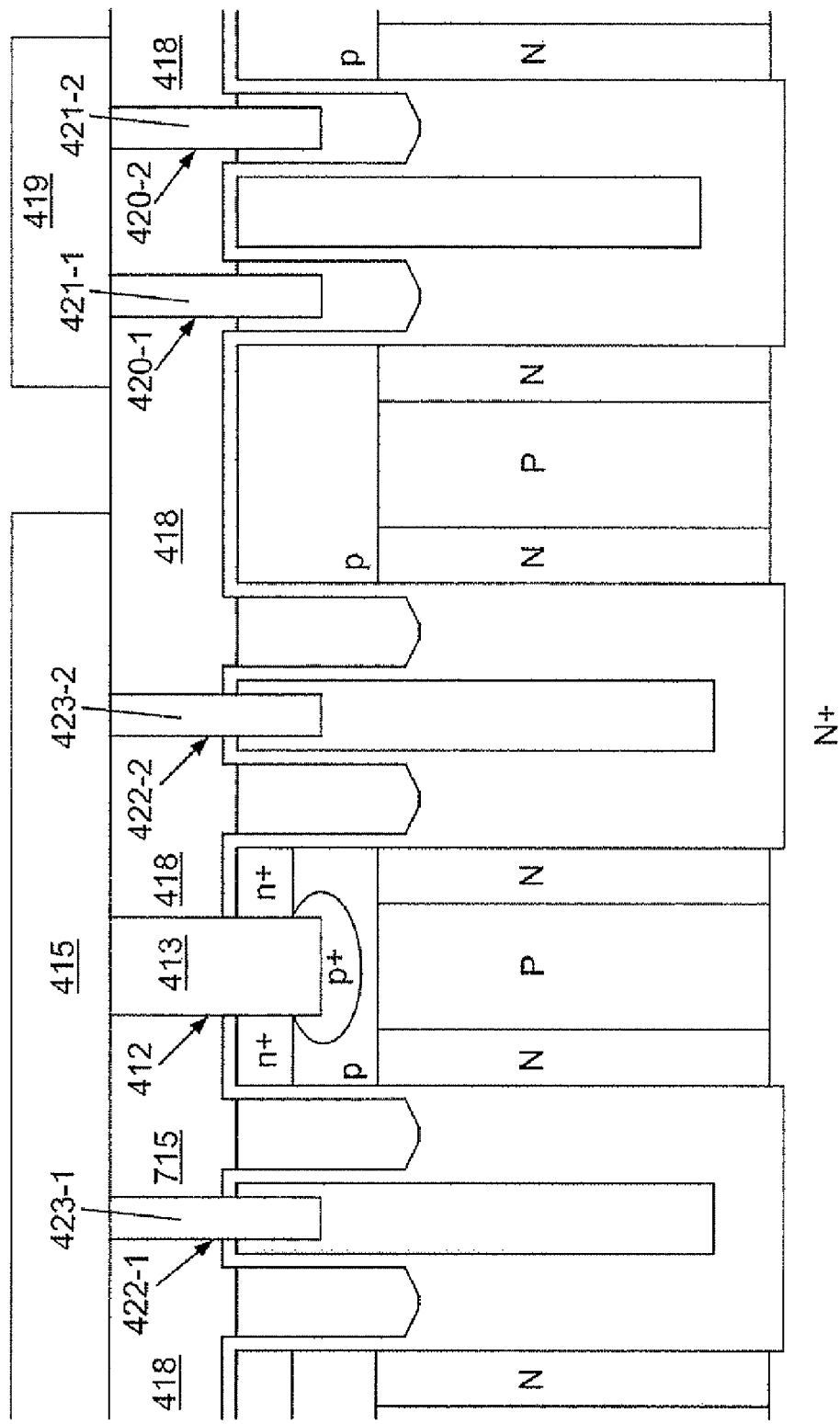

In FIG. 7H, a barrier metal layer Ti/TiN or Co/TiN or Ta/TiN is deposited on sidewalls and bottoms of all the contact holes followed by a step of RTA process for silicide formation. Then, a tungsten material layer is deposited onto the barrier metal layer, wherein the tungsten material layer and the barrier metal layer are then etched back to form: contact metal plugs (423-1 and 423-2) for trenched source electrode contacts (422-1 and 422-2); contact metal plugs 413 for trenched source-body contacts 412; and contact metal plugs (421-1 and 421-2) for trenched gate contacts (420-1 and 420-2). Then, a metal layer of Al alloys or Cu padded by a resistance-reduction layer Ti or Ti/TiN underneath is deposited onto the contact inter-layer 418 and followed by a metal etching process by employing a metal mask (not shown) to form a source metal 415 and a gate metal 419.

Although the present invention has been described in terms of the presently preferred embodiments, it is to be understood that such disclosure is not to be interpreted as limiting. Various alternations and modifications will no doubt become apparent to those skilled in the art reading the above disclosure. Accordingly, it is intended that the appended claims be interpreted as covering all alternations and modifications as fall within the true spirit and scope of the invention.

What is claimed is:

1. A Method for manufacturing a super-junction trench MOSFET comprising the steps of:
   growing an epitaxial layer of a first conductivity type upon a substrate of the first conductivity type, wherein said epitaxial layer has a lower doping concentration than said substrate;
   forming a block layer onto a top surface of said epitaxial layer;
   applying a trench mask on said block layer;
   forming a plurality of gate trenches, and mesas between adjacent gate trenches in said epitaxial layer by etching through open regions in said block layer;
   keeping said block layer substantially covering said mesas after formation of said gate trenches to block sequential angle ion implantation into top surfaces of said mesas;
   carrying out an angle Ion Implantation of a second conductivity type dopant into said mesas through said open regions in said block layer to form a plurality of first doped column regions in said mesas;
   carrying out an angle Ion Implantation of said first conductivity type dopant into said mesas through said open regions in said block layer to form a plurality of second doped column regions adjacent to the sidewalls of said gate trenches and in parallel with said first doped column regions;
   removing said block layer after formation of said first and second doped column regions;
   forming a thick oxide layer along inner surfaces of said gate trenches by thermal oxide growth of oxide deposition;
   depositing a first doped poly-silicon layer filling said gate trenches to serve as source electrodes;
   etching back said source electrodes from the top surface of said epitaxial layer;
   etching back said thick oxide layer from an upper portion of said gate trenches;
   forming a thin oxide layer as a gate oxide covering a top surface of said thick oxide layer, along upper inner surfaces of said gate trenches and along sidewalls of said source electrodes above the top surface of said thick oxide layer;
   depositing a second doped poly-silicon layer filling the upper portion of said gate trenches to serve as split gate electrodes;
   etching back said split gate electrodes by CMP (Chemical Mechanical Polishing) or plasma etch;
   carrying out a body implantation of the second conductivity type dopant and a step of body diffusion to form body regions;
   applying a source mask onto the top surface of said epitaxial layer; and
   carrying out a source implantation of the first conductivity type dopant and a source diffusion to form source regions;
   forming a contact interlayer;
   forming a plurality of trenched source-body contacts penetrating through said contact interlayer, said source regions and extending into said body regions; and
   forming body contact doped regions of the second conductivity type in said body regions and surrounding at least bottoms of said trenched source-body contacts, said body contact doped regions having a heavier doping concentration than said body regions.

2. The method of claim 1, further comprising:
   prior to carrying out the angle ion implantation of said first conductivity type dopant, diffusing said second conductivity type dopant into said mesas to form said first doped column regions between adjacent said gate trenches;
   prior to forming said thick oxide layer along inner surfaces of said gate trenches, diffusing said first conductivity type dopant into said mesas to form said second doped column regions adjacent to sidewalls of said gate trenches and in parallel surrounding said first doped column regions.

3. The method of claim 1, further comprising:
   prior to forming said thick oxide layer along inner surfaces of said gate trenches, diffusing both of said first conductivity type dopant and said second conductivity type dopant into said mesas simultaneously to respectively form said first doped column regions between two adjacent said gate trenches, and second doped column regions adjacent to sidewalls of said gate trenches and in parallel surrounding said first doped column regions.

4. The method of claim 1, wherein said gate trenches are extended into said substrate.

5. The method of claim 1, wherein said gate trenches are disposed above said substrate.

6. The method of claim 1, further comprising:
prior to carrying out the angle ion implantation of said first conductivity type dopant and said second conductivity type dopant, forming a screen oxide along the inner surfaces of said gate trenches.

7. The method of claim 6, further comprising:
prior to forming said screen oxide, forming a sacrificial oxide layer and removing said sacrificial oxide to eliminate plasma damage after forming said gate trenches.

8. The method of claim 1, wherein forming said trenched source-body contacts comprising:
depositing a tungsten metal layer padded by a barrier metal layer in said trenched source-body contacts.

9. The method of claim 1, wherein forming said trenched source-body contacts comprising:
depositing a source metal layer padded with a barrier metal layer directly into said trenched source-body contacts.

10. A super-junction trench MOSFET comprising:
a substrate of a first conductivity type;
an epitaxial layer of the first conductivity type onto said substrate, wherein said epitaxial layer has a lower doping concentration than said substrate;
a plurality of gate trenches formed from a top surface of said epitaxial layer and extending downward into said epitaxial layer in an active area;
a first insulation layer formed along trench sidewalls of a lower portion of each of said gat trenches;
a source electrode formed within each of said gate trenches and surrounded by said first insulation layer in said lower portion of each of said gate trenches;
a second insulation layer formed at least along trench sidewalls of an upper portion of each of said gate trenches and upper sidewalls of said source electrode above said first insulation layer, said second insulation layer having a thinner thickness than said first insulation layer;
a pair of split gate electrodes disposed in said upper portion of each of said gate trenches, wherein each of said split gate electrodes disposed in the middle between said source electrodes and adjacent to trench sidewall of said gate trenches, and surrounded with said second insulation layer;
a plurality of mesas formed between two adjacent gate trenches;
a plurality of first doped column regions of a second conductivity type formed in said mesas;
a plurality of second doped column regions of said first conductivity type formed in said mesas and adjacent to sidewalls of said gate trenches, located in parallel and surrounding with said first doped column regions;
a plurality of body regions of said second conductivity type formed in said mesas and adjacent to said split gate electrodes, above top surfaces of said first doped column regions and said second doped column regions between two adjacent gate trenches;
a plurality of source regions of said first conductivity type formed on top surfaces of said body regions and adjacent to said split gate electrodes in the active area;
a plurality of trenched source-body contacts each filled with a contact metal plug, penetrating through said source regions and extending into said body regions; and
a plurality of body contact doped regions of the second conductivity type within said body regions and surrounding at least bottoms of said trenched source-body contacts underneath said source regions, wherein said body contact doped regions have a higher doping concentration than said body regions.

11. The super-junction trench MOSFET of claim 10, wherein trench bottoms of said gate trenches are above a common interface between said substrate and said epitaxial layer.

12. The super-junction trench MOSFET of claim 10, wherein said gate trenches further extend into said substrate, and said first doped column regions and said second doped column regions have bottoms surfaces reaching a common interface between said substrate and said epitaxial layer.

13. The super-junction trench MOSFET of claim 10 further comprising a termination area which comprises a guard ring connected with said source regions, and multiple floating guard rings having floating voltage, wherein said guard ring and said multiple floating guard rings of said second conductivity type have junction depths greater than said body regions.

14. The super-junction trench MOSFET of claim 10 further comprising a termination area which comprises multiple floating trenched gates having floating voltage and being spaced apart by mesas comprising said body regions, said first doped columns and said second doped columns; and said floating trenched gates each having said source electrode and said split gate electrodes in said gate trenches.

15. The super-junction trench MOSFET of claim 10 further comprising a termination area which comprises multiple floating trenched gates having floating voltage and being spaced apart by mesas comprising said first doped columns and said second doped columns; and said floating trenched gates each having said source electrode and said split gate electrodes in said gate trenches.

16. The super-junction trench MOSFET of claim 10 wherein said contact metal plug is a tungsten metal layer padded by a barrier metal layer of Ti/TiN or Co/TiN.

17. The super-junction trench MOSFET of claim 10, wherein said contact metal plug is Al alloys or Cu padded by a barrier metal layer of Ti/TiN or Co/TiN or Ta/TiN, wherein said contact metal plug is also extended onto a contact interlayer to respectively formed as a source metal or a gate metal.

18. The super-junction trench MOSFET of claim 10, wherein said source regions have a uniform doping concentration and junction depth between sidewalls of said trenched source-body contacts to adjacent channel regions near said gate trenches.

19. The super-junction trench MOSFET of claim 10, wherein said source regions have a higher doping concentration and a greater junction depth along sidewalls of said trenched source-body contacts than along adjacent channel regions near said gate trenches, and said source regions have a Gaussian-distribution doping profile from the sidewalls of said trenched source-body contacts to said adjacent channel regions near said gate trenches.

20. The super-junction trench MOSFET of claim 10 further comprising at least a trenched source electrode contact filled with said contact metal plug connects said source electrode with a source metal.

21. The super-junction trench MOSFET of claim 1 further comprising at least a gate contact trench filling with a source electrode and split gate electrodes for gate connection, wherein said split gate electrodes for gate connection have at least a trenched gate contact which is filled with said contact metal plug and connects to a gate metal.

* * * * *